(12) United States Patent
Matsumoto

(10) Patent No.: US 6,372,562 B1
(45) Date of Patent: Apr. 16, 2002

(54) METHOD OF PRODUCING A SEMICONDUCTOR DEVICE

(75) Inventor: Koichi Matsumoto, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 09/506,797

(22) Filed: Feb. 18, 2000

(30) Foreign Application Priority Data

Feb. 22, 1999 (JP) .............................................. 11-042769

(51) Int. Cl.[7] .......................... H01L 21/00; H01L 21/84
(52) U.S. Cl. ...................... 438/164; 438/142; 438/592
(58) Field of Search .................................. 438/164, 241, 438/253, 396, 527, 529, 549, 142, 154, 289, 303, 592, 595, 653, 685

(56) References Cited

U.S. PATENT DOCUMENTS 6,004,842 A * 12/1999 Ikemasu et al. ............. 438/241
6,130,457 A * 10/2000 Yu et al. ...................... 257/347
6,252,280 B1 * 6/2001 Hirano ......................... 257/347

* cited by examiner

*Primary Examiner*—David Nelms
*Assistant Examiner*—Phuc T. Dang
(74) *Attorney, Agent, or Firm*—Sonnenschein, Nath & Rosenthal

(57) ABSTRACT

A method of producing a semiconductor device forming a transistor on a substrate having a first semiconductor layer, an insulating layer, and a second semiconductor layer, including the steps of forming an element isolation region connected to the first semiconductor layer on the second semiconductor layer; forming an opening in the element isolation region; forming a gate electrode on the second semiconductor layer; introducing an impurity in the second semiconductor layer and in the opening to form source/drain regions in the second semiconductor layer and to form a high concentration impurity diffusion region in the first semiconductor layer at the bottom of the opening respectively; forming an interlayer insulating layer; and forming contact holes in the interlayer insulating layer, thereby enabling formation of a semiconductor device and a substrate contact on an SOI substrate by simplified process.

14 Claims, 4 Drawing Sheets

METHOD OF PRODUCING A SEMICONDUCTOR DEVICE

The present application claims priority to Japanese Application No. P11-042769 filed Feb. 22, 1999 which application is incorporated herein by reference to the extent permitted by law.

BACKGROUND OF THE INVENTION

1. Field of the Invention

The present invention relates to a method of producing a semiconductor device, more particularly relates to a method of producing a semiconductor device enabling the semiconductor device and substrate contacts to be formed on an SOI substrate by a simplified process.

2. Description of the Related Art

In recent semiconductor devices, SOI (silicon-on-insulator or semiconductor-on-insulator) substrates enabling a decrease in the junction capacitance of a conventional semiconductor device and an improvement in its performance have become increasingly important. A semiconductor device formed on an SOI substrate has several advantages compared with a semiconductor device formed on a bulk substrate not containing an insulator layer between semiconductor layers.

In the case of forming, for example, a MOSFET on an SOI substrate, fluctuation of a threshold voltage accompanying fluctuation of a source potential (substrate potential effect) can be prevented. It is also possible to reduce the capacitance of an impurity diffusion layer since the bottom surface of the impurity diffusion layer formed in a transistor contacts the insulator layer of the SOI substrate, for example.

As mentioned above, in the case of forming a semiconductor device on an SOI substrate, a substrate terminal connected to the silicon layer under the insulator layer is required. For example, in the case of forming a MOSFET, in addition to three terminals of the gate, source, and drain, it is necessary to form the substrate terminal able to affect the threshold voltage etc.

Below, an explanation will be given of a method of producing a semiconductor device including a substrate terminal on an SOI substrate with reference to FIG. 3 and FIG. 4.

First, as shown in FIG. 3A, an SOI substrate comprising a bulk silicon substrate 1 over which is stacked, via an insulating layer 2, a semiconductor layer (silicon layer) 3 is produced. As the method of forming the SOI substrate, the method of growing single crystalline silicon on an insulating layer by a gas phase, liquid phase, or solid phase, the method of bonding substrates, the silicon implanted oxidation (SIMOX) method of implanting oxygen ions into a single crystalline silicon substrate to form an insulating layer inside it, and a method of partially increasing the porosity of silicon and oxidizing it by anodic oxidation can be mentioned.

Next, as shown in FIG. 3B, part of the silicon layer 3 is selectively converted to silicon oxide to form an element isolation region 4. The element isolation region 4 is formed, for example, by the LOCOS method of forming a silicon nitride film (not shown) on the silicon layer 3 and then heat oxidizing the silicon layer 3 using the silicon nitride layer as a mask. Alternatively, it is also possible to form the element isolation layer 4 by the shallow trench isolation (STI) method of etching the silicon layer 3 to form a trench and then forming an oxide film so as to fill the trench.

Further, a p-type or n-type impurity is introduced in the silicon substrate 1 to form a well 5.

Next, as shown in FIG. 3C, a gate insulating layer 6 comprised of silicon oxide, for example, is formed on the surface of the silicon layer 3 and a gate electrode 7 comprised of a conductor is formed on the layer 3. After the gate electrode 7 is formed, ion-implantation is performed using the gate electrode as a mask to form source/drain regions 8 by self-alignment.

Next, as shown in FIG. 4A, an interlayer insulating layer 9 comprised of a silicon oxide film is formed over the entire surface. Next, for forming electrodes connected to the source/drain regions 8 or the well 5 formed in the silicon substrate 1, contact holes 10 are formed in the interlayer insulating layer 9.

After this, as shown in FIG. 4B, an impurity is ion-implanted in a high concentration into the contacts to form a high concentration impurity diffusion layer 11 at the surface of the well 5. Due to this, an ohmic contact is obtained and the contact is decreased in resistance.

Summarizing the problems to be solved by the invention, as shown in the above conventional methods of production, the practice for forming the substrate terminal of an SOI substrate had been to form an interlayer insulating layer covering the MOSFET or other transistor, then form the contact together with the gate, source, drain, etc. or separate from the gate, source, drain, etc. The substrate is usually doped with an n-type or p-type impurity in a low concentration. Ions are implanted into the contact to form a high concentration impurity diffusion layer under the contact and thereby obtain an ohmic contact.

In the case of forming both an n-channel transistor and a p-channel transistor on a substrate, it is necessary to introduce impurities to n-type and p-type contacts respectively. Therefore, the photolithography step for implanting ions into the contacts is performed twice.

Although a semiconductor device formed on an SOI substrate exhibits excellent performance, there has been the defect of the remarkably high cost for producing an SOI substrate compared with a bulk substrate in which an insulating layer is not inserted. Therefore, in the case of forming a semiconductor device on an SOI substrate, it is necessary to simplify the process to reduce the cost of producing the semiconductor device.

SUMMARY OF THE INVENTION

An object of the present invention is to provide a method of producing a semiconductor device enabling a semiconductor device to be formed on an SOI substrate by a simplified process.

According to the present invention, there is p provided a method of producing a semiconductor device for forming a transistor on a substrate having a first semiconductor layer, an Insulating layer formed on the first semiconductor layer, and a second semiconductor layer formed on the insulating layer, comprising the steps of forming an element Isolation region connected to the insulating layer at the bottom at least at a part of the second semiconductor layer; forming an opening connected to the first semiconductor layer In the element isolation region; forming a gate insulating layer and a conductor on the second semiconductor layer; introducing an impurity in the second semiconductor layer and in the opening to form source/drain regions in the second semiconductor layer and to form a high concentration impurity diffusion region at the bottom of the opening in the first semiconductor layer; forming an interlayer insulating layer at least on the element isolation region and on the transistor forming region; and forming contact holes connected to the source/drain regions, the gate electrode, and the high concentration impurity diffusion region in the interlayer insulating layer.

Preferably, the first semiconductor layer and the second semiconductor layer comprise silicon and the substrate comprises an SOI (silicon on insulator) substrate.

Preferably, the step of forming the element isolation region comprises the steps of forming a silicon nitride layer in a predetermined pattern on the second semiconductor layer; heat-oxidizing the second semiconductor layer using the silicon nitride layer as a mask; and removing the silicon nitride layer.

Alternatively, preferably, the step of forming the element isolation region comprises the steps of forming an element isolation trench by removing at least a part of the second semiconductor layer to expose the insulating layer and forming a silicon oxide layer to fill the element isolation trench.

Alternatively, preferably, the step of forming the element isolation region comprises a step of removing at least a part of the second semiconductor layer to expose the insulating layer.

Preferably, the step of forming the opening in the element isolation region comprises a step of removing the element isolation region and the insulating layer by etching.

Preferably, the step of forming the source/drain regions comprises the steps of introducing an impurity in a relatively low concentration in the second semiconductor layer to form LDD (lightly doped drain) regions; forming sidewalls having an insulating layer on side faces of the gate electrode; and introducing an impurity in a relatively high concentration in the second semiconductor layer using the sidewalls as a mask to form source/drain regions.

Preferably, after forming the source/drain regions in the second semiconductor layer and forming the high concentration impurity diffusion region at the bottom of the opening in the first semiconductor layer, the method further comprises the steps of forming a refractory metal layer over the entire surface; performing heat treatment to silicide the refractory metal layer; and removing the part of the refractory metal layer which is not silicided.

Due to this, it is possible to reduce the photolithography step conventionally performed twice to once. In the conventional method of producing a semiconductor device, after forming contact holes in the interlayer insulating layer, ions are implanted into the bottom of the contact holes. Therefore, two photolithography steps are required for a p-type impurity diffusion region and an n-type impurity diffusion region.

On the other hand, according to the method of producing a semiconductor device of the present invention, the ion-implantation into the substrate contact is performed at the same time as the high concentration ion-implantation to form the source/drain regions. Therefore, it is possible to reduce the number of photolithography steps and simplify the process and it is also possible to reduce the production costs of semiconductor devices.

BRIEF DESCRIPTION OF THE DRAWINGS

These and other objects and features of the present invention will become clearer from the following description of the preferred embodiments given with reference to the accompanying drawings, in which.

DESCRIPTION OF THE PREFERRED EMBODIMENTS

Below, preferred embodiments of the method of producing a semiconductor device of the present invention will be explained with reference to the drawings.

Figure 1A:
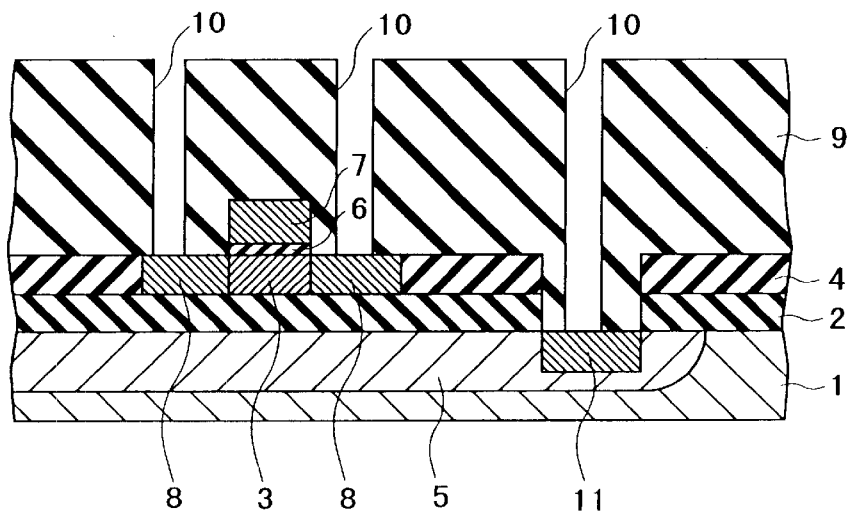
FIG. 1A is a cross-sectional view of a semiconductor device produced by the method of producing a semiconductor device of the present invention and FIGS. 1B and 1C are cross-sectional views of steps of the process of production of the semiconductor device of the present invention.

FIG. 1A is a cross-sectional view of a semiconductor device produced by an embodiment of the method of producing a semiconductor device of the present invention. A MOS transistor comprising a gate insulating layer 6, a gate electrode 7, and source/drain regions 8 is formed on an SOI substrate comprised of a silicon substrate 1, an insulating layer 2, and a semiconductor layer 3. The MOS transistor is formed on the insulating layer 2 and a p-type or n-type well 5 is formed in the silicon substrate under the insulating layer 2.

Contact holes are formed in an interlayer insulating layer 9 covering the MOS transistor. The contact holes 10 connect to the source/drain regions 8. A substrate contact is secured with the contact hole 10 connecting to the well 5 formed at the surface of the silicon substrate 1.

Next, an explanation will be made of the above embodiment of the method of producing a semiconductor device.

Figure 1B:
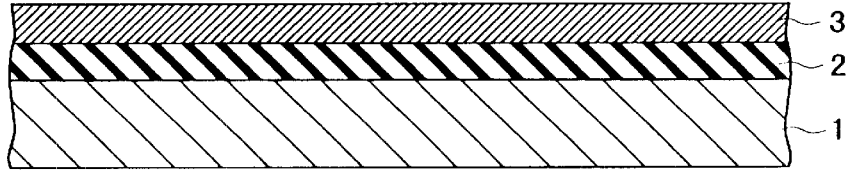

First, as shown in FIG. 1B, an SOI substrate comprised of a bulk silicon substrate 1 over which is stacked, via an insulating layer 2, a semiconductor layer (silicon layer) 3 is produced. The thickness of the insulating layer 2 and the silicon layer 3 are set at about 150 nm, for example, respectively.

The SOI substrate is formed by the method of growing single crystal silicon on an insulating layer by a gas phase or a liquid phase, the method of bonding substrates, the SIMOX method of implanting oxygen ions into a single crystal silicon substrate to form an insulating layer inside, etc.

Figure 1C:
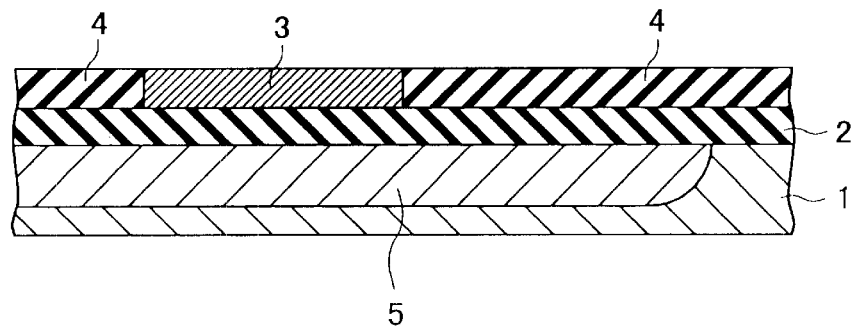

Next, as shown in FIG. 1C, a part of the silicon layer 3 is selectively converted to silicon oxide to form an element isolation region 4. The element isolation region 4 is formed, for example, by the LOCOS method of forming a silicon nitride film (not shown) on the silicon layer 3 and then heat oxidizing the silicon layer 3 using the silicon nitride layer as a mask. Alternatively, it is also possible to form the element isolation region 4 by the shallow trench isolation (STI) method of etching the silicon layer 3 to form a trench and then forming an oxide film so as to fill the trench. Alternatively, the region may be a mesa-type element isolation region in which the silicon layer 3 of the element isolation region 4 is selectively removed by etching.

Further, using a resist (not shown) as a mask, a p-type impurity is introduced into an n-channel MOS transistor (NMOS) forming region by ion-implantation etc. to form the p-well. In the same manner, an n-type impurity is introduced into a p-channel MOS transistor (PMOS) forming region by ion-implantation etc. to form the n-well. These wells are shown as the well 5 in FIG. 1C.

Figure 2A:
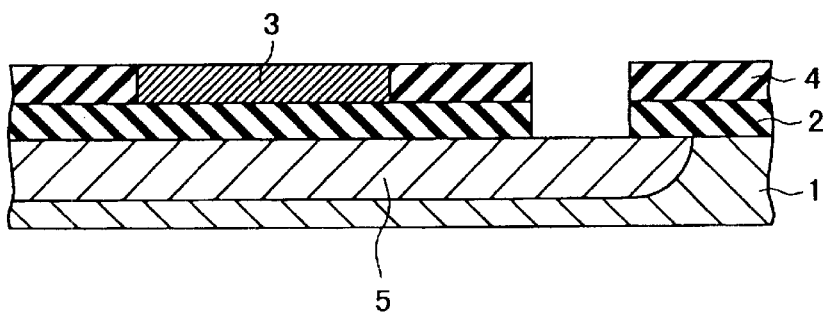
FIGS. 2A and 2B are cross-sectional views of steps of the process of production of the semiconductor device of the present invention.

Next, as shown in FIG. 2A, a resist (not shown) is formed by photolithography. Using the resist as a mask, the element isolation region 4 and insulating layer 2 near the substrate contact forming region are etched by for example reactive ion etching (RIE).

Figure 2B:
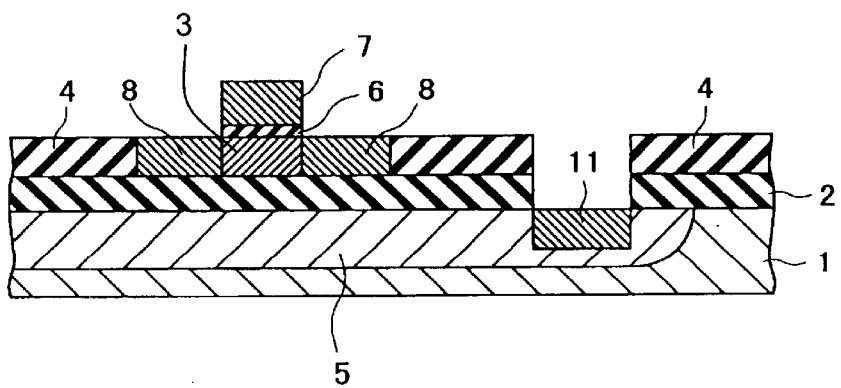
Figure 3A:
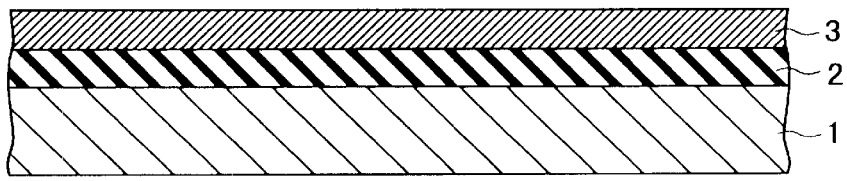
FIGS. 3A to 3C are cross-sectional views of steps of the process of production of a conventional semiconductor device.
Figure 3B:
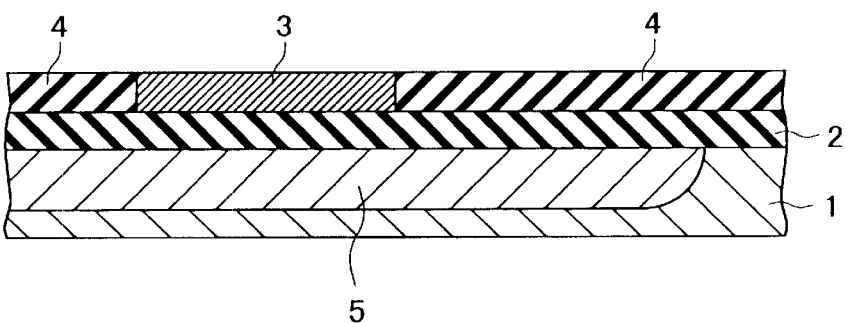
Figure 3C:
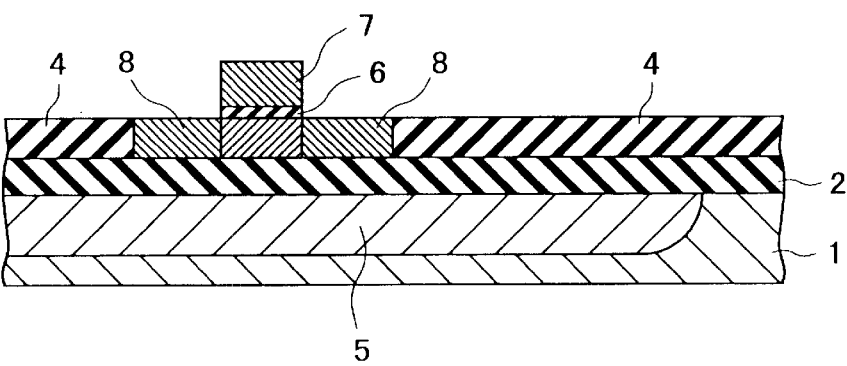
Figure 4A:
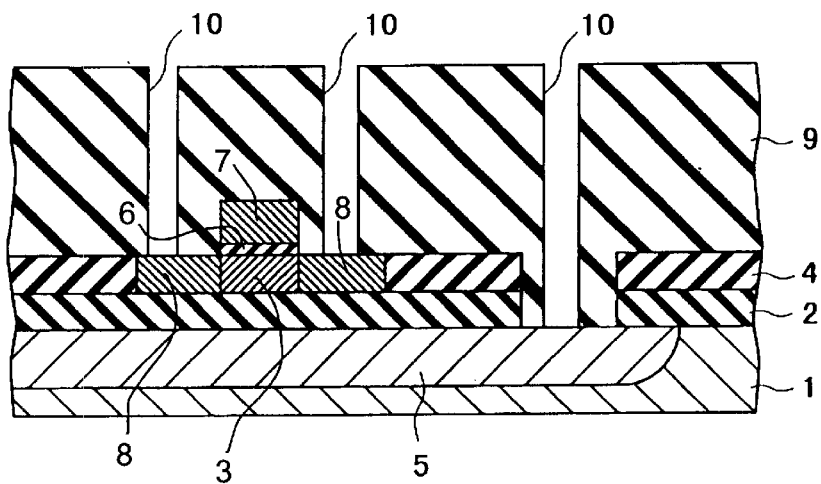
FIGS. 4A and 4B are cross-sectional views of steps of the process of production of a conventional semiconductor device.
Figure 4B:
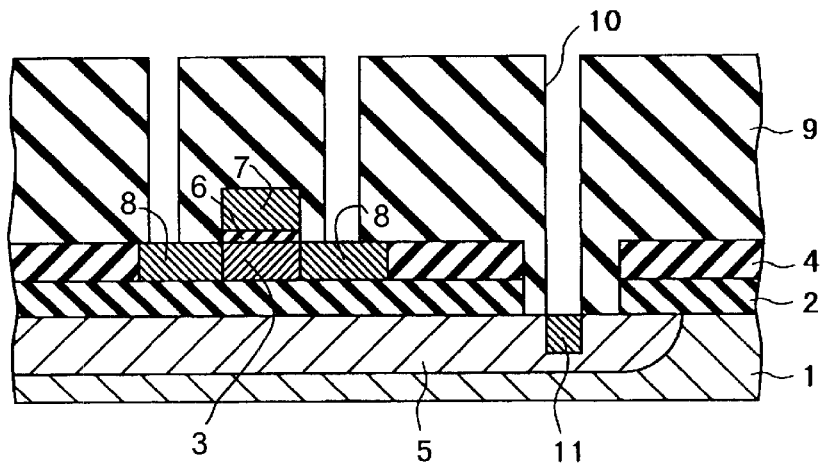

After this, as shown in FIG. 2B, a silicon oxide layer is formed at the surface of an active region as the gate insulating layer 6, a polycrystalline silicon layer not containing any impurity, for example, is stacked on it, then the polycrystalline silicon layer and the gate insulating layer are patterned to form the gate electrode 7.

Using the gate electrode 7 as a mask, an n-type impurity such as As is implanted into the silicon layer 3 of the NMOS forming region to form the source/drain regions 8 by self-alignment. The ion-implantation is performed under condition enabling introduction of the impurity in a high concentration, for example, at $3 \times 10^{15}$ atoms/cm$^2$ in dosage of As. Due to the ion-implantation, the n-type impurity is also introduced in the gate electrode 7 of the NMOS and the substrate contact connected to the n-well at the same time. Due to this, a high concentration impurity diffusion layer 11 is formed in the n-well under the contact and an ohmic contact of the substrate contact is obtained.

In the same manner, using the gate electrode 7 as a mask, a p-type impurity such as BF$_2$ is implanted into the silicon layer 3 of the PMOS forming region in a high concentration ($3 \times 10^{15}$ atoms/cm$^2$) to form the source/drain regions 8 by self-alignment. Due to the ion-implantation, the p-type impurity is also introduced in the gate electrode 7 of the PMOS and the substrate contact connected to the p-well at the same time. Due to this, a high concentration impurity diffusion layer 11 is formed in the p-well under the contact and an ohmic contact of the substrate contact is obtained.

Instead of forming the source/drain regions 8 by ion-implantation using the gate electrode as a mask as mentioned above, it is also possible to prevent a short-channel effect of a transistor by forming source/drain regions having a LDD (lightly doped drain) structure.

For making the source/drain regions 8 of the LDD structure, first, using a gate electrode 7 as a mask, an impurity is implanted in a low concentration into the NMOS forming region and the PMOS forming region respectively to form LDD regions. Next, an insulating layer such as a silicon oxide layer or a silicon nitride layer is deposited over the entire surface and then etched back to form sidewalls on the side faces of the gate electrode 7. Using the sidewalls as a mask, an impurity is implanted into the silicon layer 3 (the active region) in a relatively higher concentration than that of the LDD regions to form the source/drain regions 8.

In the case of forming the source/drain regions of the above structure, although ion-implantation is performed repeatedly into the contact connected to the well 5 in the substrate 1 at the time of forming the LDDs and the time of forming the source/drain regions, it does not matter since the conductivity type of the impurity introduced by the implantations is the same. The final concentration of impurity in the substrate contact connected to the well 5 (high concentration impurity diffusion layer 11) depends almost entirely on the dose of the impurity in the implantation for forming the source/drain regions.

After the source/drain regions 8 and a high concentration impurity diffusion layer are formed, as shown in FIG. 1A. an interlayer Insulating layer 9 comprised of silicon oxide, for example, is deposited over the entire surface. The contact holes 10 are formed in the interlayer insulating layer 9 by RIE, for example. Due to the above steps, the semiconductor device as shown in the cross-sectional view given in FIG. 1A is obtained.

Further, following conventional known techniques, conductive plugs are formed filling the contact holes 10 and metal interconnections (upper layer interconnections) connected to the contact holes 10 are formed on the interlayer insulating layer 9.

According to the above embodiment of the method of producing a semiconductor device of the present invention, it is possible to reduce the number of steps of the photolithography process performed twice so far to one step. In the case of the conventional method of producing a semiconductor device, since the ion-implantation is performed into the bottom of the contact holes after forming the contact holes in the interlayer insulating layer, two photolithography steps are required for forming a p-type impurity diffusion layer and an n-type impurity diffusion layer.

On the other hand, according to the method of producing a semiconductor device of the present invention, the ion-implantation into the substrate contact is performed at the same time as the high concentration ion-implantation for forming the source/drain regions. Therefore, it is possible to reducing the steps of photolithography to simplify the process and decrease the production costs of semiconductor devices.

The method of producing a semiconductor device of the present invention is not limited to the above embodiment.

For example, it is also possible to implant the impurity in a high concentration for forming the source/drain regions 8 and the high concentration impurity diffusion layer 11 of the substrate contact, then perform the conventional known SALICIDE (self-aligned silicide) process to reduce the resistance of the source/drain regions, the gate electrode, and the substrate contact.

In the case of performing the SALICIDE process, after the impurity is implanted in a high concentration, a refractory metal layer comprised of cobalt, titanium, nickel, or the like is formed by sputtering, for example, over the entire surface. The refractory metal layer is made to react with the silicon layer below by a thermal process such as lamp annealing to form a silicide such as CoSi$_2$ or TiSi$_2$. After this, the unreacted refractory metal layer can be removed by wet-etching using sulfuric acid/hydrogen peroxide solution, for example.

In addition, various modifications may be made within a range not outside the gist of the present invention.

Summarizing the effects of the present invention, according to the method of producing a semiconductor device of the present invention, it is made possible to form a substrate contact and a semiconductor device on an SOI substrate by a simplified process and decrease the cost of producing semiconductor devices.

While the invention has been described with reference to specific embodiment chosen for purpose of illustration, it should be apparent that numerous modifications could be made thereto by those skilled in the art without departing from the basic concept and scope of the invention.

What is claimed is:

1. A method of producing a semiconductor device for forming a transistor on a substrate having a first semiconductor layer, an insulating layer formed on the first semiconductor layer, and a second semiconductor layer formed on the insulating layer, said method comprising the steps of:

forming an element isolation region connected to the insulating layer at a bottom of the element isolation region and connected at least at a part to the second semiconductor layer;

forming an opening through the element isolation region and through the insulating layer to the first semiconductor layer;

forming a gate electrode having a gate insulating layer and a conductor on the second semiconductor layer;

introducing an impurity in the second semiconductor layer and in the opening to form source/drain regions in the second semiconductor layer and to form a high concentration impurity diffusion region at the bottom of the opening in the first semiconductor layer;

forming an interlayer insulating layer at least on the element isolation region and on the transistor forming region; and forming contact holes connected to the source/drain regions, the gate electrode, and the high concentration impurity diffusion region in the interlayer insulating layer.

2. A method of producing a semiconductor device as set forth in claim 1, wherein the first semiconductor layer and the second semiconductor layer comprise silicon and the substrate comprises an SOI (silicon on insulator) substrate.

3. A method of producing a semiconductor device as set forth in claim 1, wherein the step of forming the element isolation region comprises the steps of:

forming a silicon nitride layer in a predetermined pattern on the second semiconductor layer;

heat-oxidizing the second semiconductor layer using the silicon nitride layer as a mask; and removing the silicon nitride layer.

4. A method of producing a semiconductor device as set forth in claim 2, wherein the step of forming the element isolation region comprises the steps of:

forming a silicon nitride layer in a predetermined pattern on the second semiconductor layer;

heat-oxidizing the second semiconductor layer using the silicon nitride layer as a mask; and removing the silicon nitride layer.

5. A method of producing a semiconductor device as set forth in claim 1, wherein the step of forming the element isolation region comprises the steps of:

forming an element isolation trench by removing at least a part of the second semiconductor layer to expose the insulating layer and forming a silicon oxide layer to fill the element isolation trench.

6. A method of producing a semiconductor device as set forth in claim 2, wherein the step of forming the element isolation region comprises the steps of:

forming an element isolation trench by removing at least a part of the second semiconductor layer to expose the insulating layer and forming a silicon oxide layer to fill the element isolation trench.

7. A method of producing a semiconductor device as set forth in claim 1, wherein the step of forming the element isolation region comprises a step of removing at least a part of the second semiconductor layer and exposing the insulating layer.

8. A method of producing a semiconductor device as set forth in claim 2, wherein the step of forming the element isolation region comprises a step of removing at least a part of the second semiconductor layer and exposing the insulating layer.

9. A method of producing a semiconductor device as set forth in claim 1, wherein the step of forming the opening in the element isolation region comprises a step of removing the element isolation region and the insulating layer by etching.

10. A method of producing a semiconductor device as set forth in claim 2, wherein the step of forming the opening in the element isolation region comprises a step of removing the element isolation region and the insulating layer by etching.

11. A method of producing a semiconductor device as set forth in claim 1, wherein the step of forming the source/drain regions comprises the steps of:

forming LDD (lightly doped drain) regions by introducing an impurity in a relatively low concentration in the second semiconductor layer;

forming sidewalls having an insulating layer on side faces of the gate electrode; and forming source/drain regions by introducing an impurity in a relatively high concentration in the second semiconductor layer using the sidewalls as a mask.

12. A method of producing a semiconductor device as set forth in claim 2, wherein the step of forming the source/drain regions comprises the steps of:

forming LDD (lightly doped drain) regions by introducing an impurity in a relatively low concentration in the second semiconductor layer;

forming sidewalls having an insulating layer on side faces of the gate electrode; and forming source/drain regions by introducing an impurity in a relatively high concentration in the second semiconductor layer using the sidewalls as a mask.

13. A method of producing a semiconductor device as set forth in claim 1, wherein:

after forming the source/drain regions in the second semiconductor layer and forming the high concentration impurity diffusion region at the bottom of the opening in the first semiconductor layer, further comprising the steps of;
forming a refractory metal layer over the entire surface;
performing heat treatment to silicide the refractory metal layer; and
removing the part of the refractory metal layer which is not silicided.

14. A method of producing a semiconductor device as set forth in claim 2, wherein:

after forming the source/drain regions in the second semiconductor layer and forming the high concentration impurity diffusion region at the bottom of the opening in the first semiconductor layer, further comprising the steps of;
forming a refractory metal layer over the entire surface;
performing heat treatment to silicide the refractory metal layer; and
removing the part of the refractory metal layer which is not silicided.

* * * * *